(12) United States Patent
Cho

(10) Patent No.: US 10,782,358 B2
(45) Date of Patent: Sep. 22, 2020

(54) CIRCUIT FOR DIAGNOSING OPEN CIRCUIT IN AIRBAG DRIVING DEVICE

(71) Applicant: HYUNDAI MOBIS CO., LTD., Seoul (KR)

(72) Inventor: Chung Hoon Cho, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 61 days.

(21) Appl. No.: 16/170,771

(22) Filed: Oct. 25, 2018

(65) Prior Publication Data

US 2019/0128945 A1 May 2, 2019

(30) Foreign Application Priority Data

Oct. 27, 2017 (KR) ........................ 10-2017-0141464

(51) Int. Cl.
| | |
|---|---|
| *G01R 31/02* | (2006.01) |
| *G01R 31/50* | (2020.01) |
| *H03K 5/24* | (2006.01) |
| *H03K 17/56* | (2006.01) |
| *G01R 31/00* | (2006.01) |
| *B60R 21/017* | (2006.01) |
| *B60R 21/01* | (2006.01) |

(52) U.S. Cl.
CPC .......... *G01R 31/50* (2020.01); *B60R 21/0173* (2013.01); *G01R 31/007* (2013.01); *H03K 5/24* (2013.01); *H03K 17/56* (2013.01); *B60R 21/01* (2013.01); *B60R 2021/0115* (2013.01); *B60R 2021/01184* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

2015/0001837 A1\* 1/2015 Gluck ............... B60R 21/01558
280/735

\* cited by examiner

*Primary Examiner* — Jas A Sanghera
(74) *Attorney, Agent, or Firm* — Knobbe Martens Olson & Bear LLP

(57) ABSTRACT

A circuit for diagnosing an open circuit in an airbag driving device may include: an open circuit sensing unit configured to sense, in a test mode for diagnosing an open circuit in a power ground (PGND) of the airbag driving device, whether an open circuit is present in the power ground (PGND) of the lower switch (L_SW) using power (VH) that is applied through an upper switch (H_SW) and the lower switch (L_SW) of the airbag driving device, and an open circuit determination unit configured to receive a voltage ($V_{Drop}$) sensed by the open circuit sensing unit and determine whether the power ground (PGND) is open through a comparison between the voltage ($V_{Drop}$) and a preset first reference voltage ($V_{PG\_TH}$).

9 Claims, 5 Drawing Sheets

CIRCUIT FOR DIAGNOSING OPEN CIRCUIT IN AIRBAG DRIVING DEVICE

CROSS-REFERENCES TO RELATED APPLICATIONS

The present application claims priority to Korean application number 10-2017-0141464, filed on Oct. 27, 2017, which is incorporated by reference in its entirety.

BACKGROUND OF THE INVENTION

The present invention relates to a circuit for diagnosing an open circuit in an airbag driving device, and more particularly, to a circuit for diagnosing an open circuit in an airbag driving device, which can diagnose not only an error in a power ground terminal (PowerGND=PGND=PGx) that is the external ground of the airbag driving device but also an open circuit error in a lower switch when an operation test for the airbag driving device is performed.

In general, as illustrated in FIG. 1, an airbag driving device (or circuit) for a vehicle controls an airbag squib Rsquib coupled to the outside of the circuit by applying ignition power through a first connection pin IGH and a second connection pin IGL.

The airbag driving device includes an upper switch H_SW coupled to the first connection pin IGH inside the circuit and configured to apply driving power (or ignition power) VH when being turned on, and a lower switch L_SW coupled to the second connection pin IGL and configured to cause the driving power (or ignition power) VH to flow into the ground PGND when being turned on.

When the upper switch H_SW and the lower switch L_SW are stably turned on, the airbag squib Rsquib is ignited, and then the airbag is operated (i.e., deployed).

For reference, in the present embodiment, the ground PGND is external ground (i.e., ground using the body of the vehicle or the like), and is denoted by power ground (PowerGND=PGND) so as to be distinguished from typical circuit ground GND in circuitry for convenience of description in the present embodiment, and any one of a plurality of power grounds is denoted by PGx (where x=1, 2, 3, ... ).

Consequently, as the power ground, PowerGND, PGND, and PGx actually have the same meaning.

However, when an open power ground or a ground drift (i.e., a phenomenon in which a potential difference occurs due to incomplete ground) occurs outside the power ground PGND (outside the circuit), a problem may arise in that the airbag may not be deployed because a current path is not formed even if the lower switch L_SW is turned on while ignition is being attempted to operate (i.e., deploy) the airbag.

For reference, the open power ground means that a bonding wire or the like between the internal ground of the circuit (i.e., IC) and the ground coupled to the outside of the circuit (e.g., ground between a lead terminal and a PCB) is open.

Therefore, in conventional technology, when a lower switch of an airbag driving device (or circuit) coupled to the output terminal of an Airbag Control Unit (ACU) is diagnosed, it may be diagnosed, through a voltage division unit 30 that uses resistors, only whether an open circuit (i.e., an open circuit in a wire for coupling the contact point IGL to the lower switch, see the open circuit ② of FIG. 3) including a fault in the lower switch L_SW has occurred, as illustrated in FIG. 1. That is, in the conventional airbag driving device (or circuit) illustrated in FIG. 1, a scheme for detecting a fault (or an open circuit) in the lower switch L_SW (i.e., a detection scheme based on the voltage division unit that uses resistors) is problematic in that it is not possible to accurately determine whether an abnormality (fault) has occurred in the lower switch L_SW or the open power ground PGND has occurred.

SUMMARY OF THE INVENTION

Embodiments of the present invention are directed to a circuit for diagnosing an open circuit in an airbag driving device, which can diagnose not only an error in a power ground terminal (PowerGND=PGND=PGx) that is the external ground of the airbag driving device but also an open circuit error in a lower switch when an operation test for the airbag driving device is performed.

In one embodiment, a circuit for diagnosing an open circuit in an airbag driving device may include: an open circuit sensing unit configured to sense, in a test mode for diagnosing an open circuit in a power ground (PGND) of the airbag driving device, whether an open circuit is present in the power ground (PGND) of the lower switch (L_SW) using power (VH) that is applied through an upper switch (H_SW) and the lower switch (L_SW) of the airbag driving device; and an open circuit determination unit configured to receive a voltage ($V_{Drop}$) sensed by the open circuit sensing unit and determine whether the power ground (PGND) is open through a comparison between the voltage ($V_{Drop}$) and a preset first reference voltage ($V_{PG\_TH}$).

The test mode may be a mode configured such that, in order to sense an open circuit in the power ground (PGND) and an open circuit in the lower switch (L_SW) indicating an open circuit in a power line applied to the lower switch (L_SW), the power (VH) for airbag ignition is caused to flow through the upper switch (H_SW) and the lower switch (L_SW), rather than the power (VH) being applied to an airbag squib (Rsquib) coupled through a plurality of contact points (IGH and IGL) of the airbag driving device.

The open circuit sensing unit may be a double-diode circuit in which a forward diode (D1) and a backward diode (D2) are coupled in parallel to each other and in which an input terminal of the forward diode (D1) and an output terminal of the backward diode (D2) are coupled in common to a bottom of the lower switch (L_SW), and an output terminal of the forward diode (D1) and an input terminal of the backward diode (D2) are coupled in common to a circuit ground (GND).

The open circuit sensing unit may be a circuit implemented such that, when an open circuit occurs in the power ground (PGND), a current path through which current flows into the power ground (PGND) is not generated, and such that the forward diode (D1) is turned on and a potential difference ($V_{Drop}$) is generated while current is flowing into the circuit ground (GND).

The open circuit determination unit may be configured to, when an open circuit occurs in the power ground (PGND), output an error signal (Serial Peripheral Interface (SPI) Flag) to an upper-level control unit when a potential difference ($V_{Drop}$) generated by the open circuit sensing unit is higher than a level of the preset first reference voltage ($V_{PG\_TH}$).

The open circuit determination unit may include: a multiplexer (MUX) unit configured to select and output any one of a voltage outputted through the upper switch and a voltage inputted to the lower switch; a comparison unit configured to individually compare the voltage outputted from the MUX unit with preset one or more reference voltages ($V_{PG\_TH}$, $V_{H\_TH}$, and $P_{L\_TH}$), and output results of the comparison; and a voltage generation unit for lower switch open circuit sensing, configured to, when the lower switch (L_SW) is open, generate a preset open circuit sensing voltage and input the open circuit sensing voltage to one input terminal of the MUX unit.

The open circuit sensing voltage may be a bias voltage generated by a negative feedback circuit using a comparator.

The voltage generation unit for lower switch open circuit sensing may be implemented such that an output terminal thereof is coupled in common to an input terminal for detecting an open circuit in the lower switch (L_SW), among a plurality of voltage input terminals of the MUX unit.

When an open circuit occurs in the power line applied to the lower switch (L_SW), the open circuit determination unit may be configured such that the open circuit sensing voltage, generated by the voltage generation unit for lower switch open circuit sensing, is inputted through an input terminal for detecting an open circuit in the lower switch (L_SW), among a plurality of voltage input terminals of the MUX unit, and such that, when the open circuit sensing voltage is equal to or higher than a preset second reference voltage ($V_{L\_TH}$), an error signal (SPI Flag) is outputted to an upper-level control unit.

In accordance with an aspect of the present invention, there is an advantage in that, when an operation test for an airbag driving device is performed, not only an error in a power ground terminal (PowerGND=PGND=PGx) that is the external ground of the airbag driving device but also an open circuit error in a lower switch may be diagnosed, thus improving the performance of the airbag driving device by simply bettering the circuit.

DESCRIPTION OF SPECIFIC EMBODIMENTS

Hereinafter, a circuit for diagnosing an open circuit in an airbag driving device in accordance with embodiments of the invention will be described in detail with reference to the accompanying drawings.

It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 2:
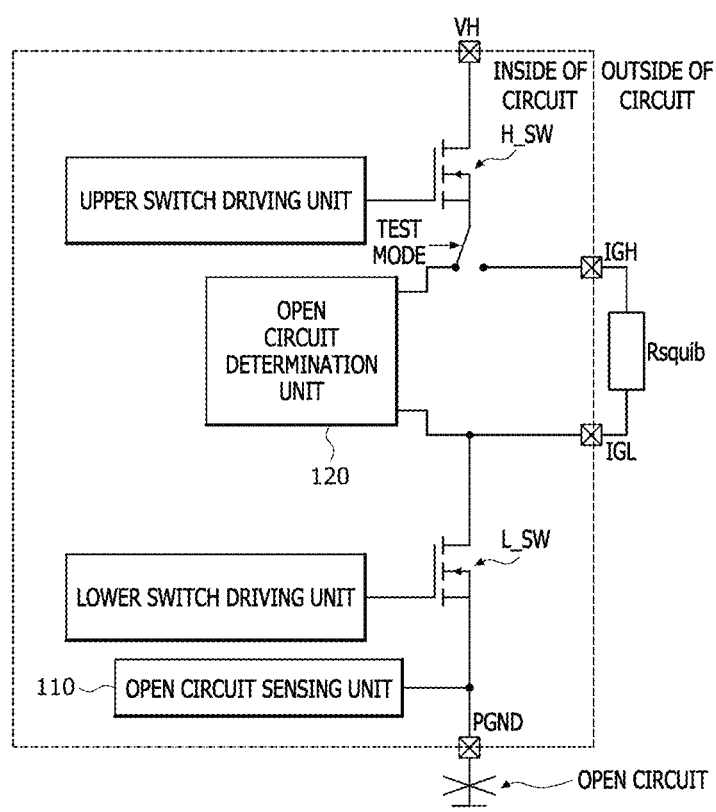
FIG. 2 is a diagram illustrating the schematic configuration of a circuit for diagnosing an open circuit in an airbag driving device according to an embodiment of the present invention.

FIG. 2 is a diagram illustrating the schematic configuration of a circuit for diagnosing an open circuit in an airbag driving device according to an embodiment of the present invention.

Figure 1:
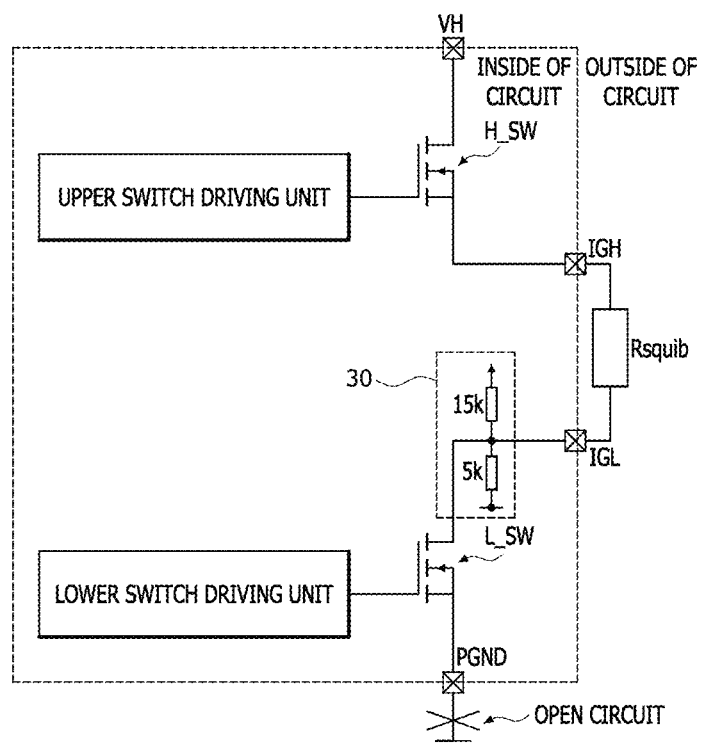
FIG. 1 is a diagram illustrating a method of diagnosing an open circuit in a conventional airbag driving device.
Figure 3:
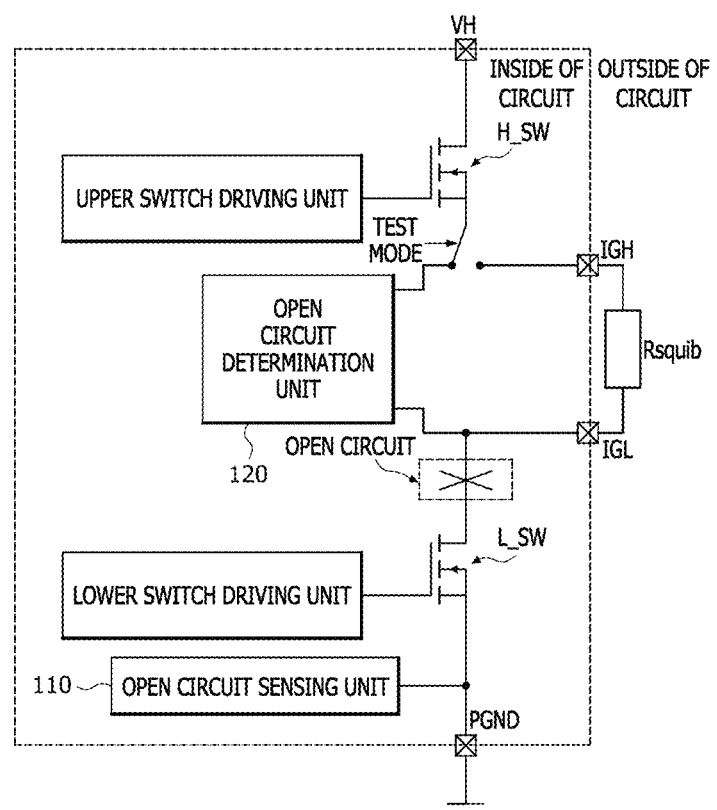
FIG. 3 is a diagram for explaining an error in the lower switch L_SW of FIG. 2.

As illustrated in FIG. 2, the circuit for diagnosing an open circuit in an airbag driving device according to the present embodiment includes an open circuit sensing unit 110 and an open circuit determination unit 120 of FIG. 1 as a circuit for sensing an error in power ground PGND (i.e., an open circuit or disconnection) and an error in a lower switch L_SW (i.e., an open circuit in a power line applied to the lower switch, see FIG. 3) by causing power VH for airbag ignition to flow through an upper switch H_SW and the lower switch L_SW rather than applying the power VH to an airbag squib Rsquib in a test mode (e.g., a mode executed in initialization such as vehicle starting).

The open circuit sensing unit 110 is a circuit for sensing whether an error (i.e., an open circuit) in the power ground PGND occurs, and the open circuit determination unit 120 is a circuit for determining whether an open circuit has occurred based on information (e.g., voltage) sensed by the open circuit sensing unit 110.

Further, the open circuit determination unit 120 may also be used as a circuit for sensing an error in the lower switch L_SW (i.e., an open circuit in a power line applied to the lower switch, see FIG. 3).

Figure 4:
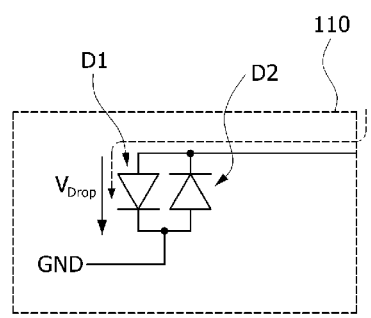
FIG. 4 is a diagram illustrating a detailed circuit of the open circuit sensing unit of FIG. 2.
Figure 5:
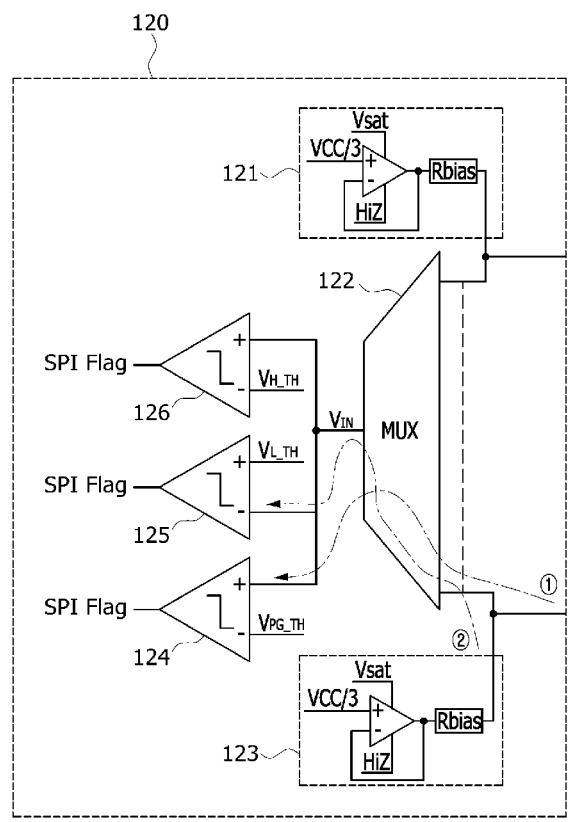
FIG. 5 is a diagram illustrating a detailed circuit of the open circuit determination unit of FIG. 2.

A detailed circuit of the open circuit sensing unit 110 is illustrated in FIG. 4, and a detailed circuit of the open circuit determination unit 120 is illustrated in FIG. 5. That is, FIG. 3 is a diagram for explaining an error in the lower switch L_SW of FIG. 2, and FIG. 4 is a diagram illustrating a detailed circuit of the open circuit sensing unit of FIG. 2.

Also, FIG. 3 is an exemplary diagram for explaining an error in the lower switch L_SW in FIG. 2.

Referring to FIG. 4, the open circuit sensing unit 110 is a double-diode circuit in which a forward diode D1 and a backward diode D2 are coupled in parallel to each other.

That is, the open circuit sensing unit 110 is a circuit in which an input terminal of the forward diode D1 and an output terminal of the backward diode D2 are coupled in common to the bottom of the lower switch L_SW and in which an output terminal of the forward diode D1 and an input terminal of the backward diode D2 are coupled in common to a circuit ground GND.

Accordingly, as illustrated in FIG. 2, when an open circuit (e.g., open circuit ①) occurs in the power ground PGND, a current path through which current flows into the power ground PGND is not generated, and instead, the forward diode D1 of the open circuit sensing unit 110 is turned on, and thus a potential difference $V_{Drop}$ is generated while current is flowing into the circuit ground GND.

Therefore, when the potential difference $V_{Drop}$ is equal to or higher than a voltage Vopgx attributable to the open circuit of the power ground PGND and is greater than the level of a preset first reference voltage $V_{PG\_TH}$, the open circuit determination unit 120 outputs an error signal (e.g., SPI Flag) to an upper-level control unit (e.g., Electronic Control Unit (ECU), Airbag Control Unit (ACU) or the like) (not illustrated).

Accordingly, the upper-level control unit (not illustrated) recognizes that an open circuit has occurred in the power ground PGND, and performs an operation corresponding thereto (e.g., outputting a warning signal or the like).

Referring to FIG. 5, the open circuit determination unit 120 includes a multiplexer (MUX) unit 122 which selects and outputs any one of a plurality of input voltages (e.g., a voltage outputted from the upper switch and a voltage inputted to the lower switch), and a plurality of comparison units 124, 125, and 126 which individually compare the voltage outputted from the MUX unit 122 with preset one or more reference voltages (e.g., $V_{PG\_TH}$, $V_{H\_TH}$, and $P_{L\_TH}$) and output the results of comparison.

The open circuit determination unit 120 further includes a voltage generation unit 123 for lower switch open circuit sensing, which generates an open circuit sensing voltage (e.g., a bias voltage corresponding to Vcc/3 through a negative feedback circuit) and inputs the open circuit sensing voltage to the MUX unit 122 when an error in the lower switch L_SW (i.e., an open circuit in a power line applied to the lower switch, see FIG. 3) occurs.

The output terminal of the voltage generation unit 123 for lower switch open circuit sensing is coupled in common to an input terminal for detecting an open circuit in the lower switch L_SW, among a plurality of voltage input terminals of the MUX unit 122.

Also, the open circuit determination unit 120 may further include a voltage sensing unit 121 for upper switch open circuit sensing, which is coupled in common to an input terminal for detecting an open circuit in the upper switch H_SW, among the plurality of voltage input terminals of the MUX unit 122, and which generates and inputs an open circuit sensing voltage (e.g., a bias voltage corresponding to Vcc/3 through a negative feedback circuit).

However, in the present embodiment, the open circuit in the upper switch H_SW is a not the technical gist of the invention, and thus a detailed description thereof will be omitted.

As illustrated in FIGS. 3 and 5, when an error in the lower switch L_SW (i.e., an open circuit in the power line applied to the lower switch) occurs (e.g., open circuit ②), a current path through which current flows through the lower switch L_SW is not generated. Instead, the open circuit sensing voltage (e.g., a bias voltage corresponding to Vcc/3 through a negative feedback circuit), generated by the voltage generation unit 123 for lower switch open circuit sensing of the open circuit determination unit 120, is inputted through the input terminal for detecting an open circuit in the lower switch L_SW, among the plurality of voltage input terminals of the MUX unit 122.

Next, a voltage VIN outputted from the MUX unit 122 is compared with the level of the preset second reference voltage $V_{L\_TH}$ by any one designated comparison unit 125, among the plurality of comparison units 124, 125, and 126.

Accordingly, any one designated comparison unit 125 of the open circuit determination unit 120 outputs an error signal (e.g., SPI Flag) to the upper-level control unit (e.g., ECU, ACU, or the like) (not illustrated) when the open circuit sensing voltage (Vcc/3) is equal to or higher than the level of the preset second reference voltage $V_{L\_TH}$.

Accordingly, the upper-level control unit (not illustrated) recognizes that an open circuit has occurred in the lower switch L_SW and performs an operation corresponding thereto (e.g., outputting a warning signal or the like).

As described above, the present embodiment is advantageous in that, when an operation test for an airbag driving device is performed, not only an error in a power ground terminal (PowerGND=PGND=PGx) that is the external ground of the airbag driving device but also an open circuit error in a lower switch may be diagnosed, thus improving the performance of the airbag driving device by simply bettering the circuit.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A circuit for diagnosing an open circuit in an airbag driving device, comprising:
   an open circuit sensing unit configured to sense, in a test mode for diagnosing an open circuit in a power ground of the airbag driving device, whether an open circuit is present in the power ground of a lower switch using power that is applied through an upper switch and the lower switch of the airbag driving device; and
   an open circuit determination unit configured to receive a voltage sensed by the open circuit sensing unit and determine whether the power ground is open through a comparison between the voltage and a preset first reference voltage.

2. The circuit of claim 1, wherein the test mode is a mode configured such that, in order to sense an open circuit in the power ground and an open circuit in the lower switch indicating an open circuit in a power line applied to the lower switch, the power for airbag ignition is caused to flow through the upper switch and the lower switch, rather than the power being applied to an airbag squib coupled through a plurality of contact points of the airbag driving device.

3. The circuit of claim 1, wherein the open circuit sensing unit is a double-diode circuit in which a forward diode and a backward diode are coupled in parallel to each other, and in which an input terminal of the forward diode and an output terminal of the backward diode are coupled in common to a bottom of the lower switch, and an output terminal of the forward diode and an input terminal of the backward diode are coupled in common to a circuit ground.

4. The circuit of claim 3, wherein the open circuit sensing unit is a circuit implemented such that, when an open circuit occurs in the power ground, a current path through which current flows into the power ground is not generated, and such that the forward diode is turned on and a potential difference is generated while current is flowing into the circuit ground.

5. The circuit of claim 1, wherein the open circuit determination unit is configured to, when an open circuit occurs in the power ground, output an error signal to an upper-level control unit when a potential difference generated by the open circuit sensing unit is higher than a level of the preset first reference voltage.

6. The circuit according to claim 1, wherein the open circuit determination unit comprises:
   a multiplexer (MUX) unit configured to select and output any one of a voltage outputted through the upper switch and a voltage inputted to the lower switch;
   a comparison unit configured to individually compare the voltage outputted from the MUX unit with preset one or more reference voltages, and output results of the comparison; and
   a voltage generation unit for lower switch open circuit sensing, configured to, when the lower switch is open, generate a preset open circuit sensing voltage and input the open circuit sensing voltage to one input terminal of the MUX unit.

7. The circuit of claim 6, wherein the open circuit sensing voltage is a bias voltage generated by a negative feedback circuit using a comparator.

8. The circuit of claim 6, wherein the voltage generation unit for lower switch open circuit sensing is implemented such that an output terminal of the voltage generation unit for lower switch open circuit sensing is coupled in common to an input terminal for detecting an open circuit in the lower switch, among a plurality of voltage input terminals of the MUX unit.

9. The circuit of claim 6, wherein, when an open circuit occurs in a power line applied to the lower switch, the open circuit determination unit is configured such that the open circuit sensing voltage, generated by the voltage generation unit for lower switch open circuit sensing, is inputted through an input terminal for detecting an open circuit in the lower switch, among a plurality of voltage input terminals of the MUX unit, and such that, when the open circuit sensing voltage is equal to or higher than a preset second reference voltage, an error signal is outputted to an upper-level control unit.

* * * * *